United States Patent
Ha (10) Patent No.: US 11,680,836 B2
(45) Date of Patent: Jun. 20, 2023

(54) METHOD FOR DETERMINING INDIVIDUAL FUEL CONSUMPTION CHARACTERISTICS OF DIFFERENT GENERATOR UNITS OF A GENERATING ASSEMBLY

(71) Applicant: COMMISSARIAT À L'ÉNERGIE ATOMIQUE ET AUX ÉNERGIES ALTERNATIVES, Paris (FR)

(72) Inventor: Duy Long Ha, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 59 days.

(21) Appl. No.: 17/119,609

(22) Filed: Dec. 11, 2020

(65) Prior Publication Data

US 2021/0181004 A1 Jun. 17, 2021

(30) Foreign Application Priority Data

Dec. 13, 2019 (FR) ...................................... 1914387

(51) Int. Cl.
*G01F 9/00* (2006.01)
*G01R 19/25* (2006.01)

(52) U.S. Cl.
CPC ........... *G01F 9/00* (2013.01); *G01R 19/2513* (2013.01)

(58) Field of Classification Search
CPC . G01F 9/00; G01F 9/001; G01F 9/005; G01F 9/006; G01F 9/008; G01F 5/00; G01F 7/00; G01R 19/2513; G05B 2219/41303; G05B 2219/41108; G06F 11/3089; G01N 2001/225; G01N 1/2247; F24H 15/00;
(Continued)

(56) References Cited

U.S. PATENT DOCUMENTS

| | | | | |
|---|---|---|---|---|
| 4,026,146 A | * | 5/1977 | Kuno ...................... | G01F 9/001 |
| | | | | 73/114.52 |
| 5,347,466 A | * | 9/1994 | Nichols ..................... | H02J 3/46 |
| | | | | 60/660 |

(Continued)

FOREIGN PATENT DOCUMENTS

| | | | | |
|---|---|---|---|---|
| CN | 106451570 B | * | 8/2018 | ............... H02J 3/46 |
| CN | 106451570 B | | 8/2018 | |

(Continued)

OTHER PUBLICATIONS

Search Report as issued in French Patent Application No. 1914387, dated Sep. 4, 2020.

(Continued)

*Primary Examiner* — Daniel R Miller
*Assistant Examiner* — Eric Sebastian Von Wald
(74) *Attorney, Agent, or Firm* — Pillsbury Winthrop Shaw Pittman LLP (57) ABSTRACT

A method for determining individual fuel consumption characteristics of different generator units of an electricity generating assembly, includes an acquisition of operation data including, for several acquisition times, a measurement of a total fuel flow rate consumed by the generating assembly, and measurements of the respective load rates of the different generator units, and a determination of the individual fuel consumption characteristics of these different generator units, from these acquired operation data.

13 Claims, 2 Drawing Sheets

(58) Field of Classification Search
CPC ............... F01N 2900/1812; F23N 5/18; F23N 2005/185; F16D 2500/3063; F02D 41/0045; F02D 19/0678; F02D 35/0069; F02D 35/0076; F02D 35/0084; F02M 69/16; H02P 9/10; H02J 2310/00
See application file for complete search history.

(56) References Cited

U.S. PATENT DOCUMENTS

2017/0051692 A1    2/2017  Zhang et al.
2020/0362720 A1*  11/2020  Klemen .................... F02C 6/08

FOREIGN PATENT DOCUMENTS

| | | | | |
|---|---|---|---|---|
| CN | 108471117 A | * | 8/2018 | |
| EP | 3 012 939 A1 | | 4/2016 | |
| EP | 3 654 485 A1 | | 5/2020 | |
| FR | 3008207 A1 | * | 1/2015 | ............ G05B 15/02 |
| JP | 2002315191 A | * | 10/2002 | |

OTHER PUBLICATIONS

Frisk, M., "On-ship Power Management and Voyage Planning Interaction," Engineering Physics Program, Uppsala Universitat, Jun. 2015, 51 pages.

* cited by examiner

METHOD FOR DETERMINING INDIVIDUAL FUEL CONSUMPTION CHARACTERISTICS OF DIFFERENT GENERATOR UNITS OF A GENERATING ASSEMBLY

CROSS-REFERENCE TO RELATED APPLICATIONS

This application claims priority to French Patent Application No. 1914387, filed Dec. 13, 2019, the entire content of which is incorporated herein by reference in its entirety.

TECHNICAL FIELD

The technical field is that of electricity generation by means of generator units.

This field is more specifically that of monitoring, and possibly driving an electricity generating assembly comprising several generator units (gensets).

TECHNOLOGICAL BACKGROUND

In numerous contexts, electricity generation is ensured not by an electric power plant supplying a whole region, but, in a more local manner, by an electricity generating assembly of smaller capacity, sometimes called "micro-network".

This is the case for example for isolated villages in which the generation of electricity is ensured by an assembly of generator units fed by a fuel source (these generator units being usually called 'gensets' in this technical field).

Heavy tonnage ships, in particular cruise ships accommodating numerous passengers, are also usually equipped with an electricity generating assembly comprising several generator units, which supply the ship with electricity. The electricity generating assembly is then managed in such a way as to supply a total electric power sufficient to supply the different installations of the ship. To do so, the number of generator units in operation, and the engine speed of each generator unit, are adjusted as a function of the total electric power demand.

The manner of distributing the total electric power to generate, among the different generator units of the generating assembly, may have an important influence on the total fuel consumption of this generating assembly. Indeed, the efficiency of a generator unit depends on its operating point and it is obviously preferable to distribute the total electric power to generate in such a way that the generator units in operation each operate close to their optimal operating point. And, even for their best operating point, not all the generator units of the assembly necessarily have the same efficiency, with the result that it may be interesting to use preferably some generator units of the generating assembly rather than others, when the total electric power to generate is small.

To be able to drive as best as possible the electricity generating assembly, in order to reduce its total fuel consumption, it is thus desirable to know the efficiency of each generator unit of the generating assembly (or any other quantity providing information regarding the fuel consumption of this unit), as well as the manner in which this efficiency varies as a function of the operating point of the generator unit (to take it into account while driving the electricity generating assembly).

The efficiency of a generator unit is generally characterised by its specific fuel consumption (SFC), that is to say by the weight of fuel consumed to generate a given electrical energy. Its specific fuel consumption may thus be expressed in grammes per kilowatt-hour (g/kWh) for example. The greater the efficiency of the generator unit, the lower its specific fuel consumption. As for the operating point of the generator unit, it is generally characterised by a load rate of the generator unit, equal to the electric power generated by the generator unit at a given time, divided by its maximum rated power.

Most manufacturers and suppliers of generator units provide specific fuel consumption values for the different models of generator units that they distribute, and do so for several load rate values.

But usually, these specific consumption values are only specified for three or four different load rate values of the generator unit. And these values do not take account of potential ageing of the generator unit since its installation, and of potential intrinsic variations in the characteristics of the units within a same series.

To obtain more precise, or more complete, specific consumption data, it could be possible to carry out tests for each generator unit of the generating assembly. But that would involve, ideally at regular intervals, an at least partial shut down of the electricity generating assembly, and modifications thereto (a disconnection of the unit to test, or the installation of an individual fuel flow meter just upstream thereof), for the time required to carry out the tests.

In this context, it would thus be desirable to be able to determine the specific fuel consumptions of the different generator units of such an electricity generating assembly, in situ, that is to say as far as possible without modification or stoppage of the electricity generating assembly.

SUMMARY

To resolve at least in part the aforementioned problems, a method for determining individual fuel consumption characteristics of different generator units of an electricity generating assembly is provided, the individual consumption characteristics associated with each generator unit being representative of the specific fuel consumption of the generator unit considered, for different load rates of the generator unit, the different generator units of said generating assembly being supplied with fuel by a same fuel source provided with a flow meter which delivers a measurement of a total fuel flow rate consumed by all of the generator units of said generating assembly, each generator unit being provided with a sensor which delivers a measurement of a load rate of the considered generator unit, the method comprising the following steps:
  a) acquiring operation data which, for different acquisition times ($t_k$) distributed over a given acquisition period, gather: the measurement of the total fuel flow rate consumed, at the acquisition time considered; and, for each generator unit of the generating assembly, the measurement of the load rate of generator unit the considered, at the acquisition time considered, and
  b) determining the individual consumption characteristics of the different generator units of the generating assembly, by a procedure for minimising a cumulative difference which takes account of a set of instantaneous differences associated respectively with the different acquisition times, each instantaneous difference being a difference, for the acquisition time considered, between: on one hand, the measurement of the total fuel flow rate and, on the other hand, an estimation of the total fuel flow rate consumed by said electricity generating assembly, said estimation of the total fuel flow rate being equal to the sum of the estimated individual flow rates, associated respectively with the different generator units of the generating assembly, each estimated individual flow rate being determined on the basis:

of the measurement of the load rate of the generator unit considered, at the acquisition time considered, and of the individual fuel consumption characteristics of the generator unit considered, said acquisition period comprising several distinct operating periods, a total electric power generated by the generating assembly being distributed between the generator units of the generating assembly in different manner during these different operating periods.

This method enables to determine the individual fuel consumption characteristics of the different generator units of the generating assembly, on the basis of the aforementioned operation data, which may be obtained during normal operation of the generating assembly (the final installation of the generating assembly having been carried on, and the generating assembly producing electricity to feed the microgrid or other electricity consuming assembly it is intended to supply, the operation data in question being acquired without requiring interruption to this normal operation), and while the electricity generating assembly is provided with a single flow meter.

The inventors have observed that the individual consumption characteristics of the generator units, determined in accordance with this method, accurately account for total fuel consumptions actually measured.

As an example, for a generating assembly comprising 3 generator units, the cumulative difference obtained (difference between the total measured flow rate and the estimation of this flow rate), for an acquisition period of 19 days, is less than around 0.1% once this difference has been minimised by adjusting the individual characteristics in question. And, over the course of this same acquisition period, for short durations, less than around 2 hours, an average difference of less than 1% was obtained (the individual characteristics in question remaining equal to those obtained by minimising the overall cumulative difference in question).

And, once these individual characteristics have been determined and fixed, it turns out that the cumulative difference between: the measurement of the total flow rate, and the estimation of this flow rate, remains less than around 2% for a subsequent period of about 19 days (whereas the individual characteristics in question then conserve fixed values). The individual consumption characteristics, determined in accordance with this method, are thus well suited to predict actual consumptions. And so, they are well suited to be subsequently used for driving the electricity generating assembly (in such a way as to minimize its total fuel consumption), or as a basis for the detection of a need for maintenance of one of the generator units.

Being able to determine precise, reliable individual fuel consumption characteristics, with a single flow meter is particularly interesting because such a flow meter is expensive, more than the sensors that equip the different generator units in order to measure their respective load rates (sensors which may be produced in the form of electric meters). Moreover, numerous electricity generating assemblies already installed and in service are provided only with an overall flow meter. Then equipping each generator unit of this assembly with an individual flow meter would thus involve a stoppage and modifications to this generating assembly.

The fact that it is possible to determine precise, reliable individual fuel consumption characteristics, with a single flow meter can be explained, inter alia, by the fact that the total electric power, generated by the generating assembly, is distributed between the generator units of the generating assembly, in different manners during the acquisition period in question (which comprises several distinct operating periods).

As an example, for an electricity generating assembly comprising three different generator units, the acquisition period could comprise three distinct operating periods, over the course of which a first, a second, then respectively a third of these generator units is shut down whereas the two others generate the electric power to be supplied. This type of operation, with an alternation between generator units, favours a precise determination of the individual consumption characteristics of the different generator units of the generating assembly. The variations in total power need during the operating periods supply another determination element for the units in operation.

And in practice, this kind of control, with an alternation between generator units, is quite common (and useful). Indeed, by precaution, the electricity generating assembly generally comprises at least one more generator unit than the number of generator units that would be just sufficient to generate the maximum total electric power for which the generating assembly is designed. Usually, it is thus not necessary to operate all of the generator units at the same time, and one of them (or even more) remains shut down. And the different generator units are managed in such a way as to shut them down in turn (or at least in such a way as to make them operate in turn in low regime), to obtain homogeneous wear and better management of maintenance between the different generator units.

The determination method described above may thus be implemented on the basis of operation data acquired during normal operation of the generating assembly. Put another way, in general, the acquisition of these operation data does not require managing the generating assembly in a manner different to its usual management, with the result that this determination method may be implemented without disrupting the normal operation of this generating assembly.

Being able to determine precisely the individual consumption characteristics of the different generator units of such a generating assembly represents a particularly important issue in practice, in particular for heavy tonnage cruise ship, on board of which the total electricity consumption is very high. Indeed, the optimisation of the management of the generator units of such a ship, which requires good knowledge of their individual characteristics, enables a substantial reduction in the ship's fuel consumption.

Once determined, these individual characteristics make it possible detecting whether one of the generator units has an operation that deviates from a reference operation considered as normal, and thus requires maintenance. Being able to detect that one or more of the generator units requires maintenance, on the basis of operation data acquired during normal operation of the generating assembly, is particularly interesting in the case already mentioned of a heavy tonnage ship. Indeed, port stops of such a ship, during which maintenance operations may be carried out, are generally short compared to the time the ship spends at sea. It is thus particularly interesting to be able to determine, before a port stop, if one or more of the generator units of the ship require maintenance.

For each generator unit of the electricity generating assembly, the aforementioned individual consumption characteristics characterise the specific fuel consumption of this generator unit, over a load rate interval which extends at least from 50% to 70%.

The individual consumption characteristics may for example be directly equal to the specific fuel consumption values of the generator unit $G_i$ considered, for several load rates of this generator unit (spread out over a load rate interval which extends at least from 50% to 70%, or from 10% to 80% at least). For each generator unit, the individual characteristics in question then group together several couples of values ($LR_j$, $SFC_{i,j}$), each couple grouping together a load rate $LR_j$, value and a corresponding specific fuel consumption $SFC_{i,j}$ value which is equal to the specific fuel consumption of the generator unit Gi when this generator unit operates with a load rate having this value $LR_j$.

But the individual consumption characteristics could also be equal to any other quantity representative of the specific fuel consumption of the considered generator unit. As an example, these individual consumption characteristics could be equal to energy efficiency values of the considered generator unit, associated respectively with different load rates of this generator unit (the efficiency in question being inversely proportional to the specific fuel consumption of the generator unit).

Furthermore, to characterise the specific fuel consumption of the generator unit for different load rates, the individual consumption characteristics could group together several specific fuel consumption, or efficiency, values associated respectively to different values of a quantity representative of the load rate of the generator unit, this quantity being possibly different from the load rate in question. As an example, this quantity could correspond to the instantaneous electric power generated by the generator unit in question, rather than to its load rate.

As for the measurements of the load rate of the different generator units, acquired at step a), they are representative of these different load rates, at the time considered. These measurements may, here again, be directly equal to these load rate values. But these measurements could also be equal to the values of the electric powers generated, at the time considered, by the different generator units of the electricity generating assembly, for example.

In the course of the determination method that has been described, the individual consumption characteristics of the different generator units of the generating assembly may be determined, in the course of the minimisation procedure of step b), in such a way as to respect the following constraint: for each generator unit, the specific fuel consumption of the generator unit is decreasing as a function of the load rate of this generator unit, over at least one interval which extends from a first load rate threshold up to a second load rate threshold.

This constraint takes into account the fact that the efficiency of a generator unit generally increases with its load rate up to reaching a maximum corresponding to the optimal operating point of the generator unit. For example, if this optimal operating point corresponds to a load rate of 85%, the efficiency of the generator unit generally increases over the whole load rate range which extends from 0% up to 85% (this efficiency next decreasing). In other words, the specific fuel consumption of this generator unit decreases over the whole load rate range which extends from 0% up to 85% (this specific consumption next increasing).

It is furthermore possible to provide that the first and second load rate thresholds, which intervene in the determination method, are chosen as a function of the type of generator unit employed. For example, if the manufacturer of these generator units indicates that the optimal operating point of these generator units corresponds to a load rate comprised between 80 and 90%, the first load rate threshold could be adjusted to a value comprised between 0 and 10% whereas the second load rate threshold will be adjusted to a value comprised between 80% and 90%, for example equal to 80%.

Taking account of this physical characteristic (i.e.: taking account of the increase in efficiency when the load rate increases), during the minimisation procedure in question, reduces the working space in which a solution minimising the cumulative difference is searched for. And so, it reduces the calculation time required to obtain this solution, that is to say to determine the individual consumption characteristics which minimise the aforementioned cumulative difference.

Moreover, this makes it possible to differentiate directly solutions (that is to say, sets of individual fuel consumption characteristics) which would minimise the cumulative difference in question but which would be incorrect physically, not representative of the actual specific consumption of the generator units.

To illustrate this point, let us consider for example the actual, real specific fuel consumptions of the different generator units of a generating assembly comprising three generator units. For these specific consumption values, the cumulative difference value is minimal.

But such a low value of the cumulative difference may be obtained also with a set of specific consumptions which would comprise:
- for the first generator unit, the actual specific consumption of this generator unit, to which would be added a function that oscillates rapidly as a function of the load rate,
- for the second generator unit, the actual specific consumption of this generator unit, from which would be subtracted the oscillating function in question (added to the specific consumption of the first unit), and
- for the third generator unit, the actual specific consumption of this generator unit.

This latter solution (with an oscillation of the specific consumption for the two first generator units) is not acceptable physically, whereas it also minimises the cumulative difference in question.

To avoid ending up with such a solution during the execution of step b) (which would then make it necessary to execute once again this step until finding a physically acceptable solution), it is thus interesting to take into account the aforementioned physical constraint, during the procedure for minimising the cumulative difference.

Apart from the characteristics described above, the determination method may have one or more of the following optional features, considered individually or according to all technically possible combinations thereof:
- the first load rate threshold is less than or equal to 10%, and the second load rate threshold is comprised between 70% and 95%;
- the cumulative difference is equal or proportional to the sum of said instantaneous differences;

each estimated individual flow rate is determined by:
  determining a specific fuel consumption corresponding to the measurement of the load rate of the generator unit considered at the acquisition time considered, by interpolation, from the individual consumption characteristics of the generator unit considered, then by multiplying said specific fuel consumption by said measurement of the load rate and by a maximum rated power of the generator unit considered;
the different operating periods of said acquisition period are at least as numerous as the generator units of the generating assembly;
said acquisition period lasts for one day at least;
said acquisition period lasts for several days and at least some of said operating periods each last for one day or more;
for each generator unit of said electricity generating assembly:
  during at least one of said operating periods, the generator unit considered operates with a load rate less than 50%, and
  during another of said operating periods, the generator unit considered operates with a load rate greater than 70%.

A method for driving an electricity generating assembly which comprises several generator units is also disclosed, the method comprising:
  determining individual fuel consumption characteristics, for the different generator units of the electricity generating assembly, according to the method for determining described above, and
  driving said generator units, so that they operate with respective load rates determined based on the individual fuel consumption characteristics previously determined.

A method for detecting a need for maintenance of one or more generator units of an electricity generating assembly comprising several generator units is also disclosed, the method comprising:
  1) determining individual fuel consumption characteristics, for the different generator units of the electricity generating assembly, according to the method for determining that has been described above, and
  2) identifying, among said generator units, of one or more generator units for which a difference, between the individual consumption characteristics (of the generator unit considered, determined at step 1) and individual reference characteristics, is greater than a given threshold, said generator unit or units being then identified as requiring maintenance.

for each generator unit, the aforementioned individual reference characteristics may be equal to:
  an average of the individual consumption characteristics having been determined, at step 1), for the other generator units of said electricity generating assembly, or to
  an average of the individual consumption characteristics having been determined, at step 1), for all of the generator units of said electricity generating assembly, or to
  individual consumption characteristics of the generator unit considered, provided by a manufacturer of the generator unit, or to
  individual consumption characteristics of the generator unit considered, which have been determined just after having installed this generator unit or just after an operation of maintenance of this generator unit or during a previous temporal period that is not separated from said acquisition period by a maintenance operation, and which have been saved to next serve as reference individual consumption characteristics for this generator unit.

A device for monitoring an electricity generating assembly is also disclosed,
  the generating assembly comprising several generator units being supplied with fuel by a same fuel source provided with a flow meter which delivers a measurement of a total fuel flow rate consumed by all of the generator units of said generating assembly, each generator unit being provided with a sensor which delivers a measurement of a load rate of the generator unit considered,
  the device for monitoring comprising at least one acquisition module, a memory and a calculation module comprising a processor, the device for monitoring being programmed to determine individual fuel consumption characteristics of the different generator units of the generating assembly, the individual consumption characteristics, associated with each generator unit being representative of the specific fuel consumption of the generator unit considered, for different load rates of the generator unit,
  the device for monitoring being programmed to determine said individual characteristics by executing the following steps:
    a) acquiring, by means of the acquisition module, operation data which, for different acquisition times ($t_k$) distributed over a given acquisition period, gather: the measurement of the total fuel flow rate consumed, at the acquisition time considered, and, for each generator unit of the generating assembly, the measurement of the load rate of the generator unit considered, at the acquisition time considered, and
    b) determining, by means of the calculation module, the individual consumption characteristics of the different generator units of the generating assembly, by a procedure for minimising a cumulative difference which takes into account a set of instantaneous differences associated respectively with the different acquisition times, each instantaneous difference being a difference, for the acquisition time considered, between: on one hand, the measurement of the total fuel flow rate, and, on the other hand, an estimation of the total fuel flow rate consumed by said electricity generating assembly, said estimation of the total fuel flow rate being equal to the sum of estimated individual flow rates, associated respectively with the different generator units of the generating assembly, each estimated individual flow rate being determined on the basis:
  of the measurement of the load rate of the generator unit considered, at the acquisition time considered, and
  of the individual fuel consumption characteristics of the generator unit considered,
    said acquisition period comprising several distinct operating periods, a total electric power generated by the generating assembly being distributed between the generator units of the generating assembly in different manner during these different operating periods.

The optional characteristics, described above in terms of method, may also apply to the device for monitoring that has been described.

BRIEF DESCRIPTION OF THE FIGURES

The figures are described for indicative purposes and in no way limit the invention.

DETAILED DESCRIPTION

Figure 1:
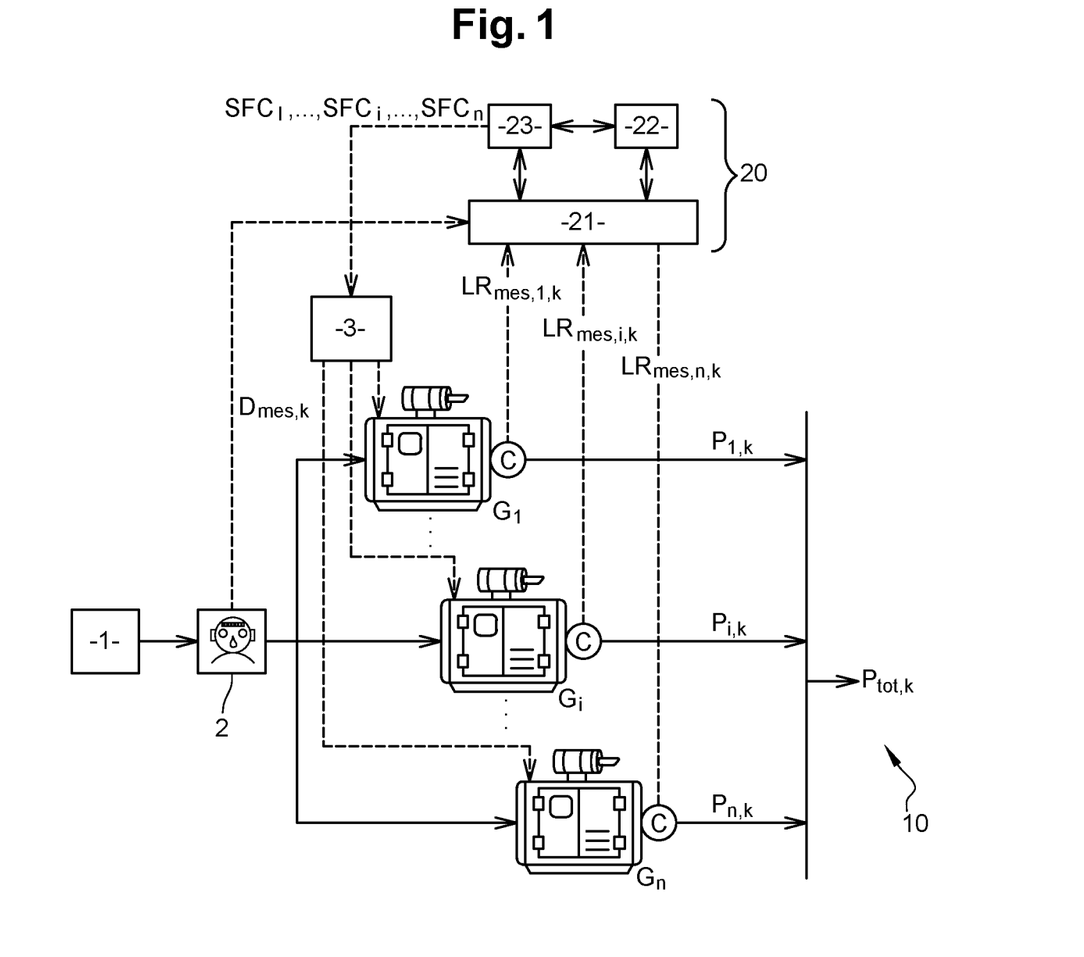
FIG. 1 schematically represents an electricity generating assembly comprising several generator units.

FIG. 1 schematically represents an electricity generating assembly 10 comprising several generator units $G_1, \ldots, G_i, \ldots, G_n$. The electricity generating assembly comprises in all n generator units. Each generator unit is marked by an integer index i, comprised between 1 and n.

Generator unit is here taken to mean a device comprising an internal combustion engine, supplied with fuel and which actuates an alternator or an electrical generator in such a way as to generate an electric power $P_1, P_i, P_n$.

The different generator units $G_1, \ldots, G_i, \ldots, G_n$ of the generating assembly 10 are supplied with fuel by a same fuel source 1 (source which is constituted of one or more fuel tanks). The fuel source 1 is provided with a measurement means 2, realised in the form of a flow meter, and which delivers a measurement of a total flow rate of fuel $D_{mes,k}$ consumed, at a given acquisition time $t_k$, by all of the generator units $G_1, \ldots, G_i, \ldots, G_n$ of the generating assembly 10.

Each generator unit $G_i$ is furthermore provided with a sensor C which delivers a measurement, $LR_{mes,i,k}$, of a load rate of the generator unit considered, at the acquisition time $t_k$.

As indicated in the foreword, the load rate of any one of the generator units of the generating assembly is equal to the electric power $P_{i,k}$ generated by this generator unit, $G_i$, at the time $t_k$ considered, divided by its maximum rated power $P_{nom,i}$.

The maximum rated power $P_{nom,i}$ of the generator unit $G_i$ is the maximum electric power that it can generate, such as specified by the manufacturer or the distributor of the generator unit. It is the maximum electric power that the generator unit can generate without premature wear or deterioration, and without heating up beyond the maximum operating temperature for which it has been designed.

The measurement $LR_{mes,i,k}$ of the load rate of the generator unit $G_i$ is representative of this load rate. It may be, as here, a value, expressed in the form of a percentage, directly equal to the load rate in question, at the considered time $t_k$. In an alternative, this measurement could however be equal to the electric power $P_{i,k}$ generated by the generator unit $G_i$ at the considered time $t_k$ (since this power is, to a multiplication factor or so, equal to the load rate in question).

The generating assembly 10 further comprises a management unit 3 which controls the different generator units $G_n$. The management unit 3 may control the shutting down and the starting up of each generator unit. It may further control each unit to operate with a given load rate. The management unit may be realised in the form of an electronic system which notably comprises a processor, a memory and a communication module to send instructions to the generator units.

The measurements delivered by the flow meter 2 and by the sensors C are transmitted to the monitoring device 20. This monitoring device 20 may comprise:
- an acquisition module 21, configured to acquire the measurements in question in order to gather together the operation data relative to the operation of the generating assembly,
- a memory 22 where, among others, these operation data are saved, and
- a calculation module 23 comprising at least one processor.

The monitoring device 20, which enables the monitoring of the operation of the generating assembly 10, may, as here, be integrated in this generating assembly. In an alternative, the monitoring device could however be delocalised, the monitoring device then being remote (by several kilometres) from the generating assembly, the aforementioned measurements then being transmitted to the monitoring device through a telecommunications network such as the Internet. In a further alternative, the monitoring device could be partially delocalised, the calculation module being delocalised, but not the other elements of this device, for example.

The monitoring device 20 is programmed to determine individual fuel consumption characteristics of the different generator units $G_1, \ldots, G_i, \ldots, G_n$ of the generating assembly 10, while executing the determination method described in detail below.

And the management unit 3 is here configured to manage the different generator units $G_1, \ldots, G_i, \ldots, G_n$ of the generating assembly 10 while taking account of these individual fuel consumption characteristics.

The monitoring device 20 may for example be programmed, each time that it determines new individual consumption characteristics, to transmit these updated characteristics to the management device 3 (so that the management device takes account of them while managing the generator units). The monitoring device could also be programmed, each time that it determines individual consumption characteristics, to save these updated characteristics in a remotely accessible memory (for example via the Internet), this memory playing the role of data server, which the management device 3 regularly interrogates.

Whatever the case, the individual fuel consumption characteristics of the different generator units $G_1, \ldots, G_i, \ldots, G_n$ of the generating assembly 10 are determined, by the monitoring device 20, on the basis of operation data of the electricity generating assembly 10, in accordance with the determination method which will now be described.

Figure 2:
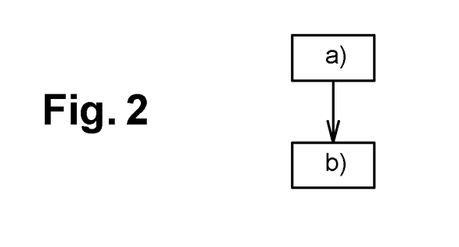
FIG. 2 schematically represents the main steps of a method for determining individual fuel consumption characteristics of the different generator units of the generating assembly of FIG. 1.

This determination method comprises the following steps (see FIG. 2):

a) acquiring operation data which, for different acquisition times $t_k$ spread out over the course of a given acquisition period, group together:
- the measurement of the total flow rate of fuel $D_{mes,k}$ consumed, at the considered acquisition time $(t_k)$, and
- for each generator unit $G_i$ of the generating assembly 10, the measurement of the load rate $LR_{mes,i,k}$ of this generator unit $G_i$, at the considered acquisition time $t_k$, and b) determining the individual consumption characteristics $SFC_{1,1}, \ldots, SFC_{i,j}, \ldots, SFC_{n,m}$ of the different generator units $G_1, \ldots, G_i, \ldots, G_n$ of the generating assembly 10, by a procedure for minimising a cumulative difference Obj which takes account of a set of instantaneous differences $EC_k$ associated respectively with the different acquisition times $t_k$, each instantaneous difference $EC_k$ being a difference, for the considered acquisition time t, between:
- on the one hand, the measurement of the total fuel flow rate $D_{mes,k}$, and
- on the other hand, an estimation of the total flow rate of fuel $D_{sim,k}$ consumed by said electricity generating assembly 10, said estimation of the total flow rate $D_{sim,k}$ being equal to the sum of the estimated individual flow rates $d_{sim,i,k}$, associated respectively with the different generator units $G_i$ of the electricity generating assembly.

Each estimated individual flow rate $d_{sim,i,k}$ being determined on the basis:
- of the measurement of the load rate $LR_{mes,i,k}$ of the considered generator unit $G_i$, at the considered acquisition time $t_k$, and
- of individual fuel consumption characteristics $SFC_{i,1}, \ldots, SFC_{i,j}, \ldots, SFC_{i,m}$ of the considered generator unit $G_i$, which are estimated characteristics, the values of which are adjusted to minimise the cumulative difference in question.

As explained in the section entitled "Summary", for each generator unit of the generating assembly, the individual consumption characteristics of the considered generator unit $G_i, \ldots, SFC_{i,j}, \ldots, SFC_{i,m}$, are representative of the specific fuel consumption of this generator unit $G_i$, and for different load rates $LR_1, \ldots, LR_j, \ldots, LR_m$.

Here, for each generator unit, the individual consumption characteristics $SFC_{i,1}, \ldots, SFC_{i,j}, \ldots, SFC_{i,m}$ are directly equal to the specific fuel consumption values of this generator unit $G_i$ corresponding respectively to the different load rates $LR_1, \ldots, LR_j, \ldots, LR_m$.

For each generator unit, the individual characteristics in question thus group together several pairs of values ($LR_j$, $SFC_{i,j}$), each pair grouping together a load rate $LR_j$ value and a corresponding specific fuel consumption $SFC_{i,j}$ value which is equal to the specific fuel consumption of the generator unit $G_i$ when this generator unit operates with a load rate having this value $LR_j$.

Each of these pairs of values is marked by an integer index j comprised between 1 and m, where m is the number of different load rate values taken into account to characterise the energy consumption of the generator unit. Here, for example, m is equal to 25 and the 25 load rate $LR_1, \ldots, LR_j, \ldots, LR_m$ values are spread out between 0% ($LR_1=0\%$) and 87% ($LR_m=87\%$). The upper value $LR_m$ of the load rates for which the individual consumption characteristics $SFC_{i,1}, \ldots, SFC_{i,j}, \ldots, SFC_{i,m}$ is determined is equal to 87%, here, because it is the largest load rate value measured over the course of the acquisition period. But this upper value $LR_m$ could be greater, or smaller, depending on the load rate values for which the generator units have operated, during the acquisition period (it could be equal to 90%, for example, if one at least of the generator units actually operates with such a high load rate, during the acquisition period).

Step a)

The acquisition period, throughout which the total flow rate $D_{mes,k}$ and load rate $LR_{mes,i,k}$ measurements are acquired, comprises several distinct operating periods. The total electric power $P_{tot,k}$ generated by the generating assembly 10 is spread out in different ways between the generator units $G_1, \ldots, G_i, \ldots, G_n$ of the generating assembly 10 over the course of these different operating periods. Put another way, the generator units of the generating assembly operate with load rates that vary with respect to each other, from one operating period to the other.

As explained in the section entitled "Summary", varying the manner in which the total load is spread out, from one operating period to the other, favours a precise determination of the individual fuel consumption characteristics of the different generator units.

Here, the acquisition period comprises at least as many different operating periods as generator units. And, for each generator unit:
- over the course of one at least of said operating periods, the generator unit considered operates with a load rate less than 50% (the generator unit could even be shut down during this operating period),
- whereas over the course of another of said operating periods, the considered generator unit operates with a load rate greater than 70%.

As an example, for an electricity generating assembly comprising three different generator units, the acquisition period could comprise three distinct operating periods, over the course of which a first, a second, then respectively a third of these generator units is shut down whereas the two others generate the electric power to provide. As already indicated, this type of operation, with an alternation between generator units, favours a precise determination of the individual consumption characteristics of the different generator units of the generating assembly.

The acquisition period may for example last for one day, or more. This is interesting because the total electric power that such an electricity generating assembly has to supply generally varies quite markedly over the course of one day. Acquiring measurements over one day or more thus makes it possible to have available operation data corresponding to quite varied load rate values, which, here again, favours a precise determination of the individual consumption characteristics of the different generator units.

It may even be provided that the acquisition duration lasts for several days, and that the different operating periods each last for one day, or more.

On the other hand, it is desirable that the acquisition duration does not last for more than two months. Indeed, if the acquisition period is too long, one or more of the generator units is liable to undergo ageing over the course of the acquisition period, making the individual characteristics obtained more difficult to interpret.

An acquisition period of which the duration is comprised between one week and 8 weeks is thus well suited.

As for the time step $\Delta t$, it may for example be comprised between 1 and 30 minutes, or, better, between 3 and 15 minutes. This time step $\Delta t$ is equal to the duration that separates two successive acquisition times $t_k$ and $t_{k+1}$ ($\Delta t = t_{k+1} - t_k$). The acquisition period comprises a total number of acquisition times $t_k$ which is noted p. The integer index k that marks each acquisition time $t_k$ is thus comprised between 1 and p, here.

As an example, for the results presented below with reference to FIG. 3, the acquisition period has a duration of 19 days, and the time step is 5 minutes.

Step b)

Here, the cumulative difference Obj, which is minimised to determine the individual consumption characteristics of the different generator units, is equal to the sum of said instantaneous differences $EC_k$, as indicated by the formula F1 below:

$$Obj = \sum_{k=1}^{k=p} EC_k. \tag{F1}$$

In an alternative, the cumulative difference Obj could take account of these different instantaneous differences $EC_k$ in another manner, for example in the form of a square root of a sum of the squares of these instantaneous differences. But calculating this cumulative difference as the sum of the instantaneous differences is nevertheless simpler and thus facilitates the minimisation procedure implemented at step b) (especially since the integer p has a relatively high value, typically greater than 1000).

Furthermore, each individual difference $EC_k$ is equal, here, to the absolute value of the difference, between, on the one hand, the measurement of the total flow rate of fuel $D_{mes,k}$ consumed by the electricity generating assembly, at the considered acquisition time $t_k$, and, on the other hand, the estimation of the aforementioned total fuel flow rate $D_{sim,k}$, i.e.:

$$EC_k = |D_{mes,k} - D_{sim,k}| \tag{F2}$$

In an alternative, the instantaneous difference $EC_k$ could nevertheless be calculated in another manner, as a function of the difference $D_{mes,k} - D_{sim,k}$ (this difference being able for example to be equal to the square, or to the cube of the absolute value of this difference).

As already indicated, the estimation of the total flow rate $D_{sim,k}$ is equal to the sum of the estimated individual flow rates $d_{sim,i,k}$, associated respectively with the different generator units $G_i$ of the generating assembly 10:

$$D_{sim,k} = \sum_{i=1}^{i=n} d_{sim,i,k}. \tag{F3}$$

And, here, each estimated individual flow rate $d_{sim,i,k}$ is determined by:
  determining a specific fuel consumption SFC_interpol corresponding to the measurement of the load rate $LR_{mes,i,k}$ of the considered generator unit $G_i$ at the considered acquisition time $t_k$, by interpolation, from the individual consumption characteristics $SFC_{i,1}, \ldots, SFC_{i,j}, \ldots, SFC_{i,m}$ of the considered generator unit $G_i$, then by
  multiplying said specific fuel consumption SFC_interpol by said measurement of the load rate $LR_{mes,i,k}$, and by the maximum rated power $P_{nom,i}$ of the considered generator unit $G_i$.

Here, each estimated individual flow rate $d_{sim,i,k}$ is thus determined in accordance with the following formula F4:

$$d_{sim,i,k} = P_{nom,i} \times LR_{mes,i,k} \times \text{SFC\_interpol}(SFC_{i,1}, \ldots, SFC_{i,m}; LR_{mes,i,k}) \tag{F4}$$

The interpolation in question makes it possible to gain precision, during the determination of the individual consumption characteristics. Indeed, the measurement of the load rate $LR_{mes,i,k}$, acquired at the time $t_k$, is not necessarily equal to one of the discrete load rate values, $LR_1, \ldots, LR_j, \ldots, LR_m$ associated with the specific consumption values to determine $SFC_{i,1}, \ldots, SFC_{i,j}, \ldots, SFC_{i,m}$.

The interpolation in question is for example a linear interpolation. In this case, when the load rate $LR_{mes,i,k}$ measurement is comprised between two successive load rate $LR_{j'}$ and $LR_{j'+1}$ values, the specific fuel consumption SFC_interpol may then be determined in accordance with the following formula F5:

$$\text{SFC\_interpol} = SFC_{i,j'} + (LR_{mes,i,k} - LR_{j'}) \times \frac{(SFC_{i,j'+1} - SFC_{i,j'})}{LR_{j'+1} - LR_{j'}}. \tag{F5}$$

The individual consumption characteristics $SFC_{i,1}, \ldots, SFC_{i,j}, \ldots, SFC_{n,m}$ of the different generator units $G_1, \ldots, G_i, \ldots, G_n$ of the generating assembly 10 are determined, over the course of the aforementioned minimisation procedure, while respecting the following constraint: for each generator unit $G_i$, the specific fuel consumption of the generator unit is decreasing as a function of the load rate of the generator unit, over at least one interval which extends from a first load rate threshold $LR_{T1}$ up to a second load rate threshold $LR_{T2}$.

This constraint, noted Cstr, is translated by the following formula F6:

$$\text{Cstr:} \{SFC_{i,j} \geq SFC_{i,j+1} \wedge j \in [j1:j2], \wedge i \in [1:n]\} \tag{F6}$$

where the integers j1 and j2 correspond respectively to the first and to the second load rate thresholds $LR_{T1}$ and $LR_{T2}$: $LR_{j1} = LR_{T1}$ and $LR_{j2} = LR_{T2}$.

The interest of taking into account this constraint, during the procedure for minimising the cumulative difference Obj, has been described in detail in the section relative to "Summary".

Here, the first and second load rate thresholds $LR_{T1}$ and $LR_{T2}$, which define the range over which the specific fuel consumption of the generator unit decreases, depend on the considered generators and may for example be chosen as follows: $LR_{T1} = 0\%$ (i.e. j1=1), and $LR_{T2} = 87\%$ (i.e. j2=m). Indeed, for the type of generator units of this electricity generating assembly used as example, a decrease in the specific fuel consumption is expected, as a function of the load rate, over this entire load rate range (and, next, a rise in the specific fuel consumption, over the load rate range 87%-100%, a range which is generally avoided).

The aforementioned minimisation procedure thus consists, here, in searching for the individual consumption characteristics $SFC_{i,1}, \ldots, SFC_{i,j}, \ldots, SFC_{n,m}$ which, for the acquired operation data, make it possible to minimise, or at least to reduce, the cumulative difference Obj, while respecting the constraint Cstr.

The minimisation procedure may be carried out by any technique for minimising under constraint (in this instance under linear inequality constraint) a non-linear function of several variables known to those skilled in the art (the variables in question being the individual consumption characteristics of the different generator units). As an example, this minimisation procedure may be implemented using a "fmincon" function of the "Matlab" script language developed by the "MathWorks®" company.

The individual consumption characteristics have given values, initially, before launching the minimisation procedure. In other words, this minimisation starts from given initial values. These initial values may correspond for example to values supplied by a manufacturer of the generator units. They may also be equal to the last known values for these individual characteristics, obtained during a prior execution of the determination method and saved in a memory of the monitoring device 20.

It will be noted that the minimisation procedure in question may lead to a cumulative difference Obj value which is not necessarily an absolute minimum, or even necessary a local minimum, but which is in any case smaller than that which would be obtained without adjustment of the individual consumption characteristics of the generator units (that is to say on the basis of the initial values of these characteristics, without executing step b). Optionally, the minimisation procedure in question could stop when the cumulative difference Obj becomes less than a threshold value, this threshold value being for example equal to 1% of the sum, from k=1 to p, of the flow rate $D_{mes,k}$ measurements (the individual consumption characteristics obtained at this stage then being considered as reliable, even if the value of the cumulative difference is not strictly minimal).

Figure 3:
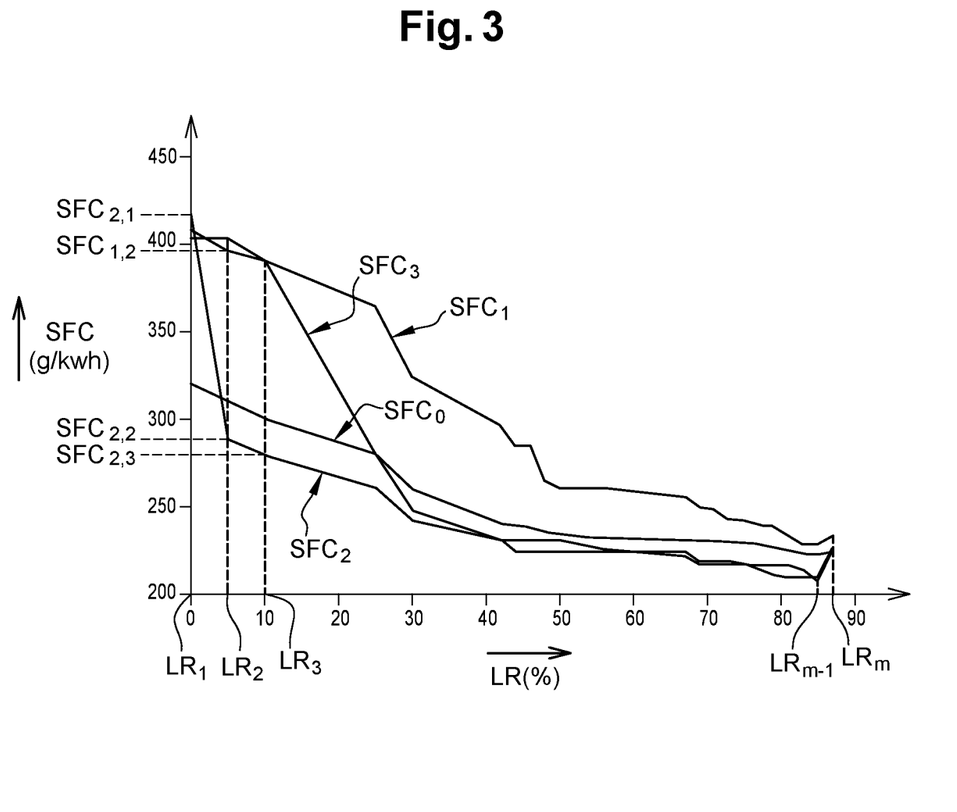
FIG. 3 shows specific fuel consumption curves, which are the individual consumption characteristics in question, for the different generator units of the generating assembly of FIG. 1.

FIG. 3 shows an example of the result obtained, using the method that has been described, for a generating assembly comprising 3 generator units $G_1$, $G_2$ and $G_3$ (that is to say for which n=3).

In FIG. 3 are thus represented 3 curves, $SFC_1$, $SFC_2$ and $SFC_3$ which show, for these 3 generator units $G_1$, $G_2$, $G_3$, the evolution of the specific fuel consumption of the considered generator unit (expressed in grammes per kilowatt-hour, g/kWh), as a function of the load rate LR (expressed in percent, %).

Each of these curves gathers together, for the considered generator unit, all of the specific consumption $SFC_{i,1}$, ..., $SFC_{i,m}$ values obtained at the end of the determination method. As an example, the first point of the curve $SFC_2$ is a coordinates point ($LR_1$; $SFC_{2,1}$), the second point of this curve is a coordinates point ($LR_2$, $SFC_{2,2}$), and so on (see FIG. 3).

In FIG. 3 is also represented a curve SFCo, which shows the initial specific fuel consumption values which serve as starting point during the execution of the minimisation procedure of step b).

In this example, the 3 generator units $G_1$, $G_2$ and $G_3$ are of the same model, have been installed at the same date, and have operated, since their installation, for comparable total durations.

It is however observed that their individual fuel consumption characteristics, here their specific consumption curves $SFC_1$, $SFC_2$ and $SFC_3$, are indeed different from each other.

The first generator unit $G_1$ has in fact a specific fuel consumption considerably greater than the two other generator units $G_2$ and $G_3$. For example, for a load rate of 50%, it is observed that the first generator unit $G_1$ has a specific fuel consumption of 260 g/kWh whereas the two other units have specific consumptions of 230 g/kWh and 224 g/kWh respectively.

This example illustrates one of the interests that there is in thus carrying out a type of monitoring, in place, of the specific fuel consumptions of the generator units of the generating assembly. Indeed, once obtained, the individual consumption characteristics of these units make it possible, as here, to detect that one of the generator units (here the first unit $G_1$) has an abnormally high specific consumption, which notably shows that a maintenance operation could be desirable for this generator unit.

For this example, after minimisation (minimisation at the end of which the curves $SFC_1$, $SFC_2$, $SFC_3$ have been obtained), the value obtained for the cumulative difference Obj is less than 0.1%. For this example, the acquisition period lasts for 19 days, as indicated above. And over the course of this same acquisition period, for short durations, less than around 2 hours, an average difference less than 1% has been obtained (the individual characteristics in question remaining equal to those obtained by minimising the overall cumulative difference in question). Moreover, once these specific fuel consumptions $SFC_1$, $SFC_2$, $SFC_3$ have been determined (by minimisation) and fixed, it turns out that the cumulative difference between the measurement of the total flow rate and the estimation of this flow rate, remains less than around 2% for a period, later, of around 19 days, whereas the specific consumptions in question then conserve fixed values, which shows that the specific consumptions thus obtained have a predictive value, and thus indeed correspond to the actual (real) specific consumptions of the generator units, such as they could be measured by removing each set from the generating assembly to carry out consumption tests.

It will be noted that to determine the individual consumption characteristics of the generator units with good precision it has been necessary to consider that these generator units could have different individual characteristics, even though they are generator units of the same model and which have been installed at the same date, which appears particularly surprising a priori.

It will furthermore be noted that the individual consumption characteristics of the different generator units are here considered as independent of each other (those associated with one generator unit are independent of those associated with another generator unit), during the minimisation procedure, and this is so even if the generator units in question are of a same model, and have been installed at the same date. In other words, there is a different set of individual characteristics for each generator unit of the generating assembly, and during the minimisation procedure, the number of sets of different individual characteristics, which are adjusted during the minimisation procedure, is equal to the number n of generator units of the generating assembly 10.

Figure 4:
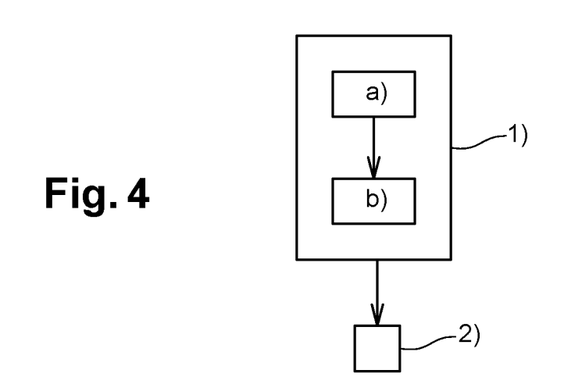
FIG. 4 schematically represents steps of a method for detecting a need for maintenance of a generator unit of an electricity generating assembly such as that of FIG. 1.

The monitoring device 20 is furthermore programmed to execute the method for detecting a need for maintenance described below.

In the course of this method, the monitoring device 20 executes the following steps (FIG. 4):

1) determination of the individual fuel consumption characteristics of the different generator units $G_1$, ..., $G_i$, ..., $G_n$ of the electricity generating assembly 10, said determination being carried out in accordance with the determination method that has been described above, and 2) identification, among said generator units, of one or more generator units for which a difference, between the individual consumption characteristics of the considered generator unit $G_i$, determined at step 1) and the individual reference characteristics $SFC_{ref,i}$, is above a given threshold, the generator unit(s) in question then being identified as requiring maintenance.

In practice, the threshold in question may for example be equal to 5%, in relative value, or to 10% or instead 20%. In practice, a detection based on a threshold of 10% proves to be both sensitive and reliable.

The difference between the individual consumption characteristics of the generator unit $G_i$ considered, and its individual reference characteristics $SFC_{ref,i}$, may, like here, be a cumulated difference, obtained by summation (by integration) over all of the considered load rates.

The individual reference characteristics $SFC_{ref,i}$ of the generator unit $G_i$ may be equal to an average of the individual consumption characteristics which were determined previously, at step 1), for the other generator units of the electricity generating assembly (that is to say for the units other than the unit $G_i$, for which it is sought to determine if it has to undergo a maintenance operation).

Determining the individual reference characteristics $SFC_{ref,i}$ in this way would lead for example, for the situation corresponding to the example described above with reference to FIG. 3, to determining that the first set $G_1$ requires a maintenance operation, since its specific consumption curve $SFC_1$ is clearly greater than the average of the specific consumption curves $SFC_2$ and $SFC_3$ of the two other generator units $G_2$ and $G_3$.

In an alternative, the individual reference characteristics $SFC_{ref,i}$ in question could, for each generator unit $G_i$, be equal to an average of the individual consumption characteristics which were determined previously, at step 1), for all of the generator units $G_1, \ldots, G_i, \ldots, G_n$ of the generating assembly 10 (in which case the individual reference characteristics $SFC_{ref,i}$ are the same whatever the generator unit).

The individual reference characteristics $SFC_{ref,i}$ could also be characteristics supplied by a manufacturer of the generator unit.

For each generator unit of the generating assembly, the individual reference characteristics $SFC_{ref,i}$, could also be equal to the individual consumption characteristics of the generator unit $G_i$ considered
- that have been determined, for example by means of the determination method described above, just after having installed the generator unit $G_i$ considered, or just after an operation of maintenance of this generator unit, or instead during a preceding temporal period not separated from the acquisition period by a maintenance operation (which would make it possible to detect a drift of the performances of the generator unit),
- and that have been saved (for example in the memory 22 of the monitoring device) to next serve as reference individual characteristics for this generator unit.

"Just after" is taken to mean more precisely within a maximum time limit of 3 weeks after the installation or the maintenance of the generator unit.

Furthermore, as indicated above, the management device 3 is programmed to manage the different generator units $G_1, \ldots, G_i, \ldots, G_n$ while taking account of the individual fuel consumption characteristics of these different generator units, determined previously thanks to the determination method which has been described above.

This management is carried out more particularly in such a way that the generator units operate with respective load rates that are determined on the basis of the individual fuel consumption characteristics of these generator units (determined beforehand).

It is possible for example to provide to determine, at each time, the respective load rates at which the different generator units are to be managed, in such a way as to supply a total power demand while minimising the total fuel consumption of the generating assembly 10. In order to be able to minimise this total consumption, this determination is based on the individual consumption of these different generator units (characteristics obtained previously, thanks to the determination method described above). This determination may for example be carried out in accordance with the method described in the patent application EP19207140, not yet published on the date of filing of the present patent application, and belonging to the applicant.

In an alternative, or as a complement, the management device 3 could be programmed to maintain shut down as far as possible any generator unit for which a need for maintenance has been detected (thanks to the detection method described above). In this case, as long as the total electric power demand may be supplied by the other generator units (i.e.: those which do not require maintenance), the generator unit(s) requiring maintenance remain shut down.

The invention claimed is:

1. A method for determining individual fuel consumption characteristics of different generator units of an electricity generating assembly,
    the individual consumption characteristics associated with each generator unit being representative of a specific fuel consumption of the generator unit considered, for different load rates of the generator unit,
    the different generator units of said generating assembly being supplied with fuel by a same fuel source provided with a flow meter which delivers a measurement of a total fuel flow rate consumed by all of the generator units of said generating assembly,
    each generator unit being provided with a sensor which delivers a measurement of a load rate of the considered generator unit,
    the method comprising the following steps:
    a) acquiring operation data which, for different acquisition times distributed over a given acquisition period, gather:
        the measurement of the total fuel flow rate consumed, at the considered acquisition time, and
        for each generator unit of the generating assembly, the measurement of the load rate of the generator unit considered, at the acquisition time considered, and
    b) determining the individual consumption characteristics of the different generator units of the generating assembly, by a procedure for minimising a cumulative difference that takes into account a set of instantaneous differences associated respectively with the different acquisition times, each instantaneous difference being a difference, for the acquisition time considered, between:
        on one hand, the measurement of the total fuel flow rate, and
        on the other hand, an estimation of the total fuel flow rate consumed by said electricity generating assembly, the estimation of the total fuel flow rate being equal to a sum of estimated individual flow rates, associated respectively with the different generator units of the generating assembly, each estimated individual flow rate being determined on the basis:
            of the measurement of the load rate of the generator unit considered, at the acquisition time considered, and
            of the individual fuel consumption characteristics of the generator unit considered,
    said acquisition period comprising several distinct operating periods, a total electric power generated by the generating assembly being distributed between the generator units of the generating assembly in different manners during these different operating periods.

2. The method according to claim 1, wherein the individual consumption characteristics of the different generator units of said generating assembly determined during said minimisation procedure are determined according to the following constraint: for each generator unit, the specific fuel consumption of the generator unit is decreasing as a function of the load rate of the generator unit, over at least one interval which extends from a first load rate threshold up to a second load rate threshold.

3. The method according to claim 2, wherein the first load rate threshold is less than or equal to 10%, and wherein the second load rate threshold is comprised between 70% and 95%.

4. The method according to claim 1, wherein the cumulative difference is equal or proportional to the sum of said instantaneous differences.

5. The method according to claim 1, wherein each estimated individual flow rate is determined by:
   determining a specific fuel consumption corresponding to the measurement of the load rate of the generator unit considered, at the acquisition time considered, by interpolation, from the individual consumption characteristics of the generator unit considered, then by
   multiplying said specific fuel consumption by said measurement of the load rate and by a maximum rated power of the generator unit considered.

6. The method according to claim 1, wherein the different operating periods of said acquisition period are at least as numerous as the generator units of the generating assembly.

7. The method according to claim 1, wherein said acquisition period lasts for one day at least.

8. The method according to claim 1, wherein said acquisition period lasts for several days and wherein at least some of said operating periods each last for one day or more.

9. The method according to claim 1, wherein, for each generator unit of said electricity generating assembly:
   during at least one of said operating periods, the generator unit considered operates with a load rate less than 50%, and
   during another of said operating periods, the generator unit considered operates with a load rate greater than 70%.

10. Method for driving an electricity generating assembly which comprises several generator units, the method comprising:
    determining individual fuel consumption characteristics, for the different generator units of the electricity generating assembly, according to the method for determining according to claim 1, and
    driving said generator units so that they operate with respective load rates that are determined based on the individual fuel consumption characteristics previously determined.

11. Method for detecting a need for maintenance of one or more generator units of an electricity generating assembly comprising several generator units, the method comprising:
    1) determining individual fuel consumption characteristics for the different generator units of the electricity generating assembly, according to the method for determining of claim 1, and
    2) identifying, among said generator units one or more generator units for which a difference between:
       the individual consumption characteristics of the generator unit considered, determined at step 1), and
       individual reference characteristics
       is greater than a given threshold, said generator unit or units being then identified as requiring maintenance.

12. The method for detecting a need for maintenance according to claim 11, wherein the individual reference characteristics are equal, for each generator unit, to:
    an average of the individual consumption characteristics having been determined, at step 1), for the other generator units of said electricity generating assembly, or to
    an average of the individual consumption characteristics having been determined, at step 1), for all of the generator units of said electricity generating assembly, or to
    individual consumption characteristics of the generator unit considered, provided by a manufacturer of the generator unit, or to
    individual consumption characteristics of the generator unit considered, which have been determined just after having installed this generator unit or just after an operation of maintenance of this generator unit, or instead during a preceding temporal period that is not separated from said acquisition period by a maintenance operation, and which have been saved to next serve as individual consumption reference characteristics for this generator unit.

13. A device for monitoring an electricity generating assembly,
    the generating assembly comprising several generator units being supplied with fuel by a same fuel source provided with a flow meter which delivers a measurement of a total fuel flow rate consumed by all of the generator units of said generating assembly, each generator unit being provided with a sensor which delivers a measurement of a load rate of the generator unit considered,
    the device for monitoring comprising at least one acquisition module, a memory and a calculation module comprising a processor, the device for monitoring being programmed to determine individual fuel consumption characteristics of the different generator units of the generating assembly, the individual consumption characteristics, associated with each generator unit being representative of a specific fuel consumption of the generator unit considered, for different load rates of the generator unit,
    the monitoring device being programmed to determine said individual characteristics by executing the following steps:
    a) acquiring, by the acquisition module, operation data which, for different acquisition times distributed over a given acquisition period, gather:
       the measurement of the total fuel flow rate consumed, at the considered acquisition time, and
       for each generator unit of said generating assembly, the measurement of the load rate of the generator unit considered, at the acquisition time considered, and saving the acquired operation data in said memory, and
    b) determining, by the calculation module, the individual consumption characteristics of the different generator units of said generating assembly, by a procedure for minimising a cumulative difference that takes into account a set of instantaneous differences associated respectively with the different acquisition times, each instantaneous difference being a difference, for the acquisition time considered, between:
       on one hand, the measurement of the total fuel flow rate, and
       on the other hand, an estimation of the total fuel flow rate consumed by said electricity generating assembly, the estimation of the total fuel flow rate being equal to a sum of estimated individual flow rates, associated respectively with the different generator units of the electricity generating assembly, each estimated individual flow rate being determined on the basis:
       of the measurement of the load rate of the generator unit considered, at the acquisition time considered, and of the individual fuel consumption characteristics of the generator unit considered, said acquisition period comprising several distinct operating periods, a total electric power generated by the generating assembly being distributed between the generator units of the generating assembly in different manner during these different operating periods.

* * * * *